United States Patent
Awad et al.

(10) Patent No.: US 6,815,806 B1
(45) Date of Patent: Nov. 9, 2004

(54) ASYMMETRIC PARTIALLY-ETCHED LEADS FOR FINER PITCH SEMICONDUCTOR CHIP PACKAGE

(75) Inventors: Elie Awad, Essex Junction, VT (US); Paul J. Panaccione, Newburyport, MA (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 10/623,090

(22) Filed: Jul. 17, 2003

(51) Int. Cl.[7] .................. H01L 23/495; H01L 23/48
(52) U.S. Cl. .................. 257/666; 257/690; 257/692; 257/693
(58) Field of Search .................. 257/666, 672, 257/674, 676, 690–693, 775, 739, 684, 784, 696, 698, 730, 787, 776

(56) References Cited

U.S. PATENT DOCUMENTS

| | | | |
|---|---|---|---|
| 5,557,143 A | | 9/1996 | Seiji |
| 5,567,655 A | | 10/1996 | Rostoker et al. |
| 5,751,057 A | * | 5/1998 | Palagonia |
| 5,859,387 A | | 1/1999 | Gagnon |
| 5,945,259 A | | 8/1999 | Kim |
| 6,201,292 B1 | * | 3/2001 | Yagi et al. |
| 6,229,200 B1 | | 5/2001 | Mclellan et al. |
| 6,242,281 B1 | | 6/2001 | Mclellan et al. |
| 6,414,385 B1 | | 7/2002 | Huang et al. |

* cited by examiner

Primary Examiner—Long Pham
Assistant Examiner—DiLinh Nguyen
(74) Attorney, Agent, or Firm—Christopher R. Paste; William Steinberg; Hancock & Estabrook, LLP

(57) ABSTRACT

A chip package having an array of leads, wherein successive leads are staggered in all three dimensions (X, Y, and Z) relative to one another. Such a staggered arrangement permits a large number of leads available in a confined space while maintaining the minimum separation necessary between adjacent leads. The leads are formed by placing asymmetric top and bottom masks on a lead frame, and partially etching the top of the lead frame, while partially and over etching the bottom of the lead frame. Although the resulting leads are staggering in three dimensions, no additional processing steps are needed beyond those used to fabricate conventional packages.

9 Claims, 5 Drawing Sheets

ASYMMETRIC PARTIALLY-ETCHED LEADS FOR FINER PITCH SEMICONDUCTOR CHIP PACKAGE

BACKGROUND OF THE INVENTION

1. Field of Invention

The present invention relates to semiconductor chip packages, such as quad flat no-lead (QFN) packages and, more specifically, to a system and method for reducing pitch and increasing the lead count on such packages.

2. Description of Prior Art

An integrated chip package, such as a QFN package, comprises a plastic encapsulated semiconductor die mounted to a lead frame having a die pad and exposed outer leads on the periphery of the package. The lead frame is commonly fabricated from an electrically conductive material, such as metal, and chemically etched according to a predetermined pattern to form the leads. The pattern of lead is dictated by the use of an etching mask that is positioned against the lead frame and dictates which portions are etched away. Once the lead frame has been etched to form the leads, excess material is removed by saw singulation.

Electronic devices using such packages are constantly shrinking in size while demanding increased processing power. As faster and more powerful chips are developed, however, the I/O counts increase and a higher number of leads are required on the package. The numbers of leads that can be formed by conventional etching, however, are limited by the thickness of the lead frame material and the physical requirements for a minimum degree of spacing between leads. Thus, there is a constant need to increase the number of leads in a QFN package while reducing the space used by the leads.

One attempt to increase the number of leads on the lead frame involves the etching of double rows of leads into periphery of the lead frame. The use of additional rows, however, increases the overall footprint of the package and requires an additional saw singulation step to free the additional row from the lead frame. Previous attempts to increase the number of leads in other types of packages have involved the bonding of an additional row of leads over the top of the primary leads with an insulating adhesive. The physical bonding of additional rows, however, requires additional processing steps and may increase the overall height of the package.

3. Objects and Advantages

It is a principal object and advantage of the present invention to provide a chip package having a high number of leads that does not increase the dimensions of the package.

It is an additional object and advantage of the present invention to provide a method for forming a chip package having a high number of leads that does not require additional processing steps.

It is a further object and advantage of the present invention to provide a chip package having a high number of leads that can be fashioned from a single lead frame.

Other objects and advantages of the present invention will in part be obvious, and in part appear hereinafter.

SUMMARY OF THE INVENTION

In accordance with the foregoing objects and advantages, the present invention comprises a chip package having an array of leads that are staggered in all three dimensions, thus increasing the number of leads available in a confined space while maintaining the minimum separation necessary between adjacent leads. The leads are formed by over etching the lead frame with asymmetric top and bottom masks that are offset from one another. Although the resulting leads are staggered in three dimensions, no additional processing steps are needed beyond those used to fabricate conventional packages.

In one embodiment, the present invention contemplates a lead frame for use in a chip carrier package, comprising a central region having a first plurality of sides; a peripheral edge region having a second plurality of sides positioned in spaced relation around the central region; a first set of leads extending from each of the second plurality of sides, each of the first set of leads being partially defined by a first terminal end, first opposing side surfaces each of which extends along a respective first longitudinal axis, and a lower surface that extends in a first plane; a second set of leads extending from the second plurality of sides, each of the second set of leads being partially defined by a second terminal end, second opposing side surfaces each of which extends along a respective second longitudinal axis, and an upper surface that extends in a second plane; wherein each of the first set of leads are positioned in staggered relation to corresponding ones of the second set of leads such that the first terminal ends are spaced from the second terminal ends by a first predetermined distance, each of the first longitudinal axes are parallel to and spaced from the adjacent ones of the second longitudinal axes by a second predetermined distance, and the first plane is spaced from the second plane by a third predetermined distance.

The preferred method for forming the lead frame of a predetermined thickness for a chip carrier package, comprises the basic steps of providing a lead frame having an upwardly facing surface and a downwardly facing surface, a central region having a first plurality of sides, and a peripheral edge region having a second plurality of sides extending around and spaced from the first plurality of sides; providing an upper mask to position resist material on the upwardly facing surface that define a first set of leads extending from each of the second plurality of sides, each of the first set of leads being partially defined by a first terminal end, first opposing side surfaces each of which extends along a respective first longitudinal axis, and a lower surface that extends in a first plane; providing a lower mask to position resist material on the downwardly facing surface that define a second set of leads extending from the second plurality of sides, each of which is partially defined by a second terminal end, second opposing side surfaces each of which extends along a respective second longitudinal axis, and an upper surface that extends in a second plane, and a portion of the second set of leads that are vertically aligned with a portion of the first set of leads; etching away portions of the upwardly facing surface that are not covered with the resist material to a depth greater than one half of the predetermined thickness; and etching away portions of the downwardly facing surface that are not covered with the resist material to a depth greater than one half of the predetermined thickness, wherein each of the first set of leads are positioned in staggered relation to corresponding ones of the second set of leads such that the first terminal ends are spaced from the second terminal ends by a first predetermined distance, each of the first longitudinal axes are parallel to and spaced from the adjacent ones of the second longitudinal axes by a second predetermined distance, and the first plane is spaced from the second plane by a third predetermined distance.

The chip package resulting from this manufacturing process comprises a first set of leads each of which is partially defined by a first terminal end, first opposing side surfaces each of which extends along a respective first longitudinal axis, and a lower surface that extends in a first plane, and a second set of leads each of which is partially defined by a second terminal end, second opposing side surfaces each of which extends along a respective second longitudinal axis, and an upper surface that extends in a second plane, wherein each of said first set of leads are positioned in staggered relation to corresponding ones of said second set of leads such that said first terminal ends are spaced from said second terminal ends by a first predetermined distance, each of said first longitudinal axes are parallel to and spaced from the adjacent ones of said second longitudinal axes by a second predetermined distance, and said first plane is spaced from said second plane by a third predetermined distance. A chip may then be mounted to the die pad and wire interconnects can interconnect the chip's input/outputs to corresponding ones of the first and second sets of leads. An epoxy resin, or other conventional encapsulation material, may then encapsulate the package which may then be mounted on an integrated circuit board.

BRIEF DESCRIPTION OF THE DRAWINGS

The present invention will be more fully understood and appreciated by reading the following Detailed Description in conjunction with the accompanying drawings, in which.

DETAILED DESCRIPTION

Figure 1:
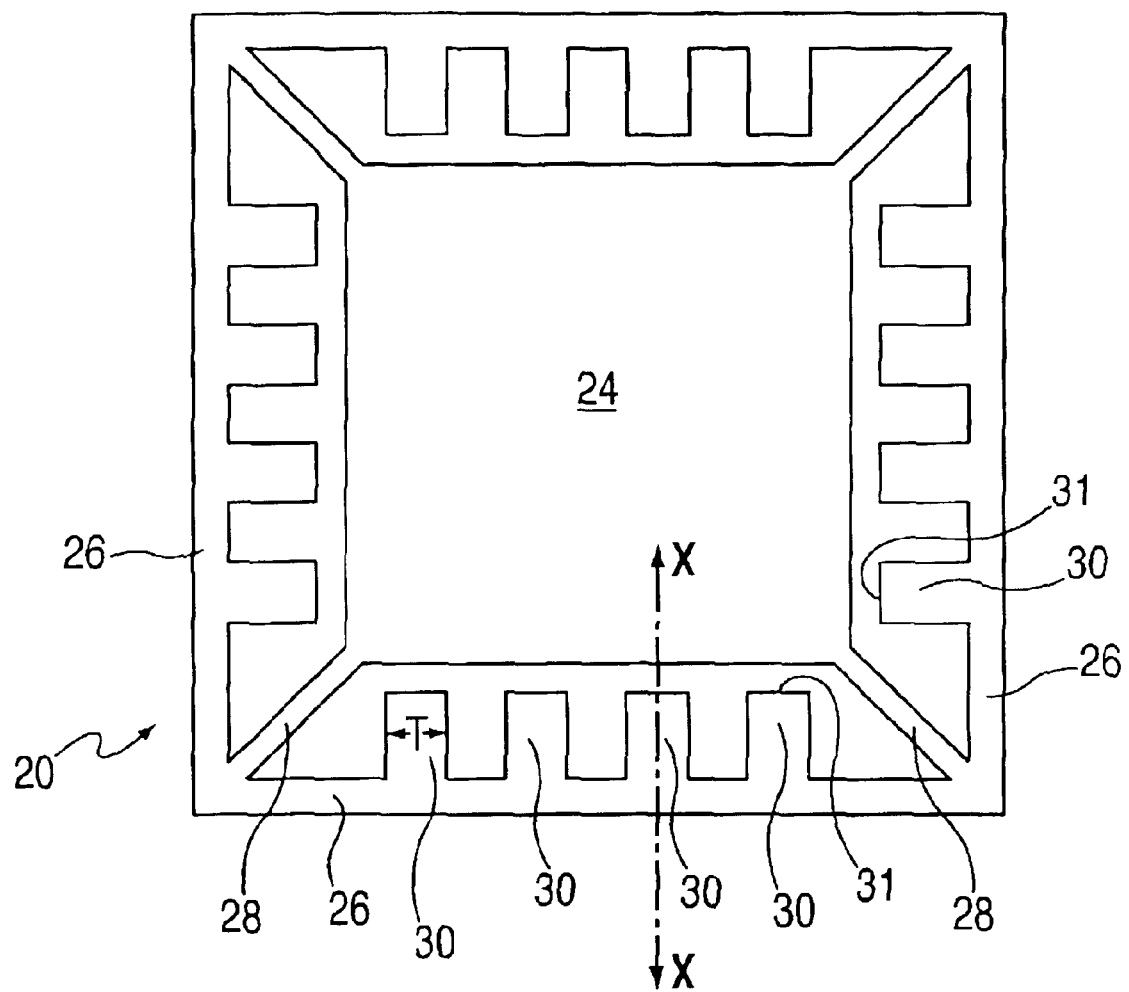
FIG. 1 is a top view of the top resist pattern according to the present invention.

Referring now to the drawings, wherein like reference numerals refer to like parts throughout, there is seen a lead frame for a chip package (such as, for example, a QFN package), designated generally by reference numeral 10, comprising a central region (commonly referred to in the industry as a "die pad") 12 and a peripheral edge 14 extending in spaced relation to central region 12, and upper and lower sets of conductive leads 16, 18, respectively, extending inwardly from peripheral edge 14. As will be described in greater detail hereinafter, upper leads 16 are spaced from successively positioned ones of lower leads 18 in each of the three dimensions of a Cartesian coordinate system (X, Y, and Z). Lead frame 10 is manufactured using traditional etching processes, such as chemical etching, or equivalent chip package manufacturing processes, such as mechanical punching.

Referring to FIG. 1, upper mask 20 includes a central region 24 of resist material that corresponds to central region (die pad) 12 of lead frame 10, a peripheral edge region 26 of resist material that corresponds with the peripheral edge 14 of lead frame 10, diagonally extending regions (commonly referred to in the industry as "tie bars") 28 of resist material diagonally extending fully between the corners of central region 24 and peripheral edge region 26, and a series of laterally spaced apart, rectangular-shaped projections 30 extending inwardly from peripheral edge region 26 towards central region 24 a predetermined distance where they terminate at terminal ends 31. It should be understood that the mask 20 is entirely symmetrical in that each side of mask 20 is identical to all other sides. Projections 30 are of a generally uniform thickness, T, and extend along a longitudinal axis X-X.

Figure 2:
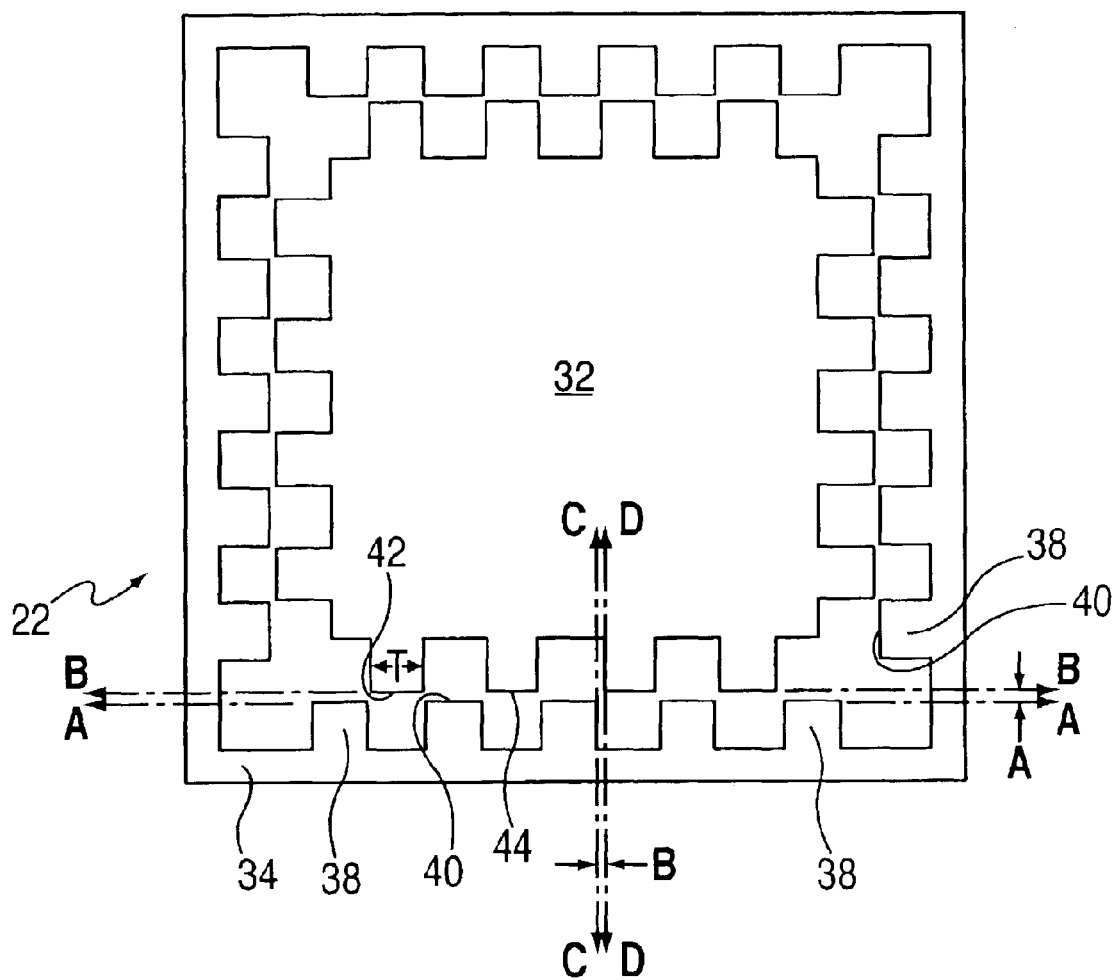
FIG. 2 is a bottom view of the bottom resist pattern according to the present invention.
Figure 3:
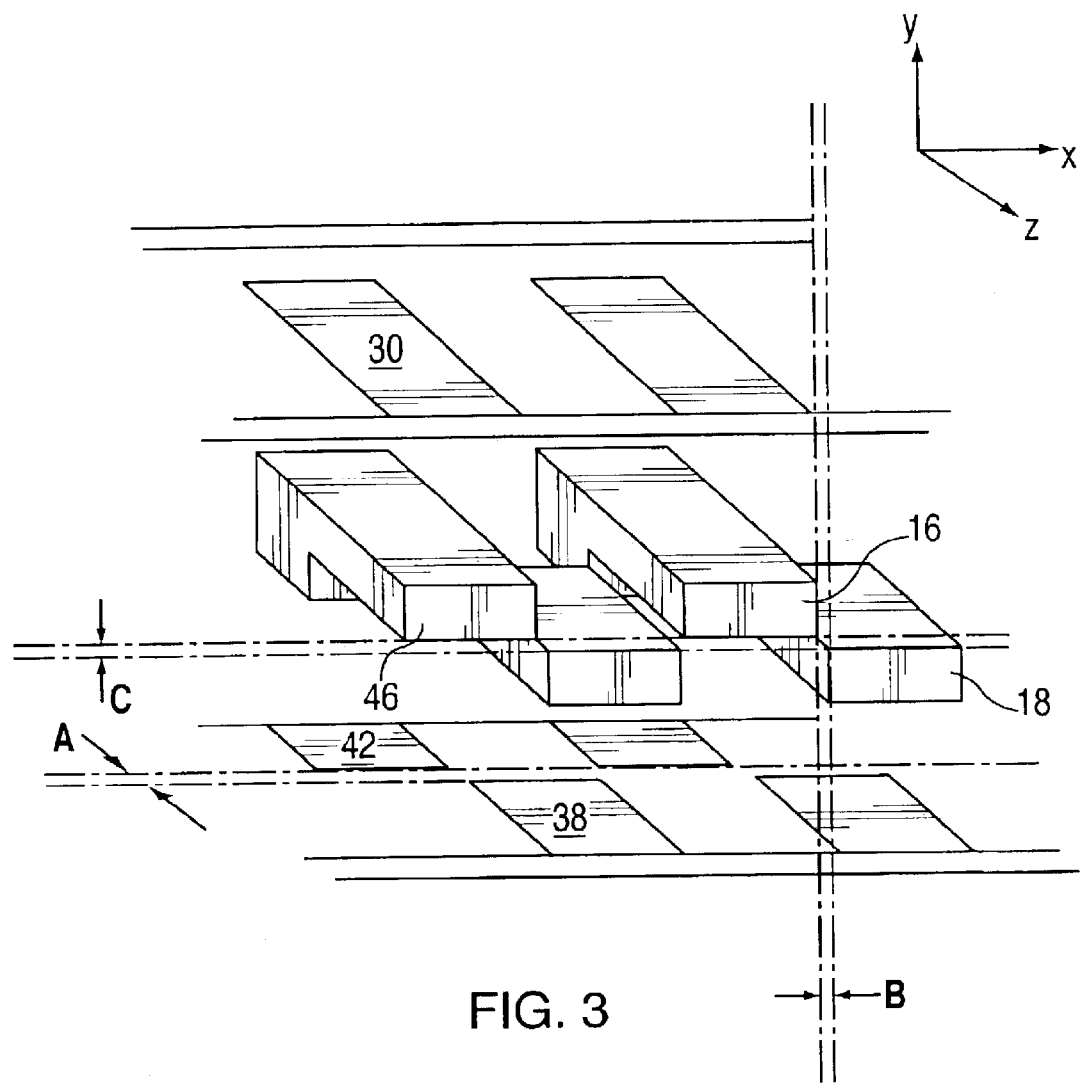
FIG. 3 is a perspective view of the asymmetric top and bottom resist pattern with respect to the leads of the present invention.

Referring to FIG. 2, lower mask 22 includes a central region 32 of resist material that corresponds to central region 12 of lead frame 10, a peripheral edge region 34 of resist material that corresponds with peripheral edge 14 of lead frame 10, a series of laterally spaced apart, rectangular-shaped projections 38 of resist material extending inwardly from peripheral edge region 34 towards central region 32 a predetermined distance where they terminate at terminal ends 40, and a series of laterally spaced apart rectangular-shaped (may be square-shaped) projections 42 of resist material that are of the same thickness T as projections 30, and positioned between central region 32 and peripheral edge region 34 and include terminal ends 44 nearest peripheral edge region 34. The terminal ends 40 and terminal ends 44 positioned along any one side of mask 22 each extend along respective, common longitudinal axes A-A and B-B, respectively, that are substantially parallel to one another and spaced apart by a predetermined distance A. In addition, the side edges of projections 38 and the side edges of projections 42 that are successively positioned adjacent one another extend along respective longitudinal axes. C-C and D-D, respectively, that are substantially parallel to one another and spaced apart by a predetermined distance B.

Figure 4:
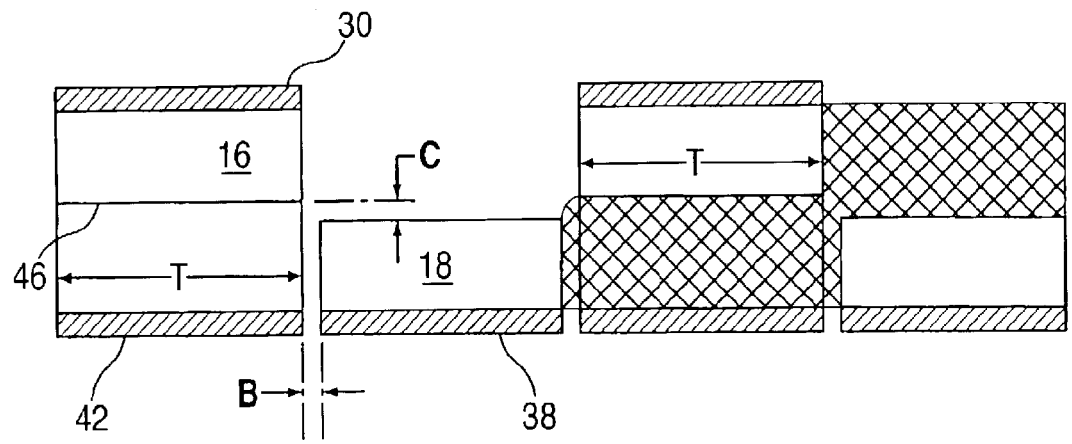
FIG. 4 is a front view of the leads of the present invention.
Figure 5:
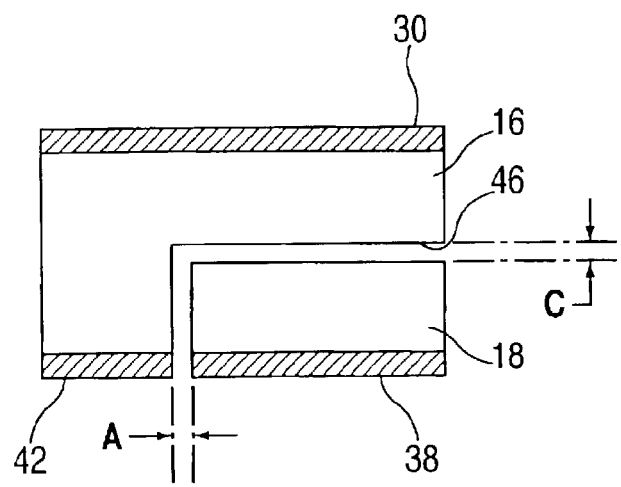
FIG. 5 is a side view of the leads of the present invention.

When manufacturing lead frame 10, mask 20 is laid over the top surface of the metal lead frame (preferably composed of copper), and mask 22 is laid over the bottom surface of lead frame 10, with the central regions 24, 32, and peripheral edge regions 26, 34, being vertically aligned with one another, thereby creating a lead frame having a masking that will produce an asymmetrical lead pattern. When aligned in this manner, projections 42 are vertically spaced from, but co-linearly aligned along axis X-X with corresponding ones of projections 30, as illustrated in FIG. 5. When etching away material from the top surface of lead frame 10 and then away from the bottom surface of lead frame 10, the material removed from the regions not covered with resist material leaves central region 12, peripheral edge 14, and leads 16, 18. Due to the positioning of the resist material on masks 20, 22, and the amount of material removed during the etching (or over-etching) process (the etching process removes material to a depth that is slightly greater than one half the thickness of the lead frame), leads 16 take on an L-shape with the bottom surface 46 of the leg of the L extending in a first plane, and the upper surface 48 of leads 18 extending in a second plane that is parallel to and spaced from the first plane by a predetermined distance C, as illustrated in FIGS. 4 and 5.

Although there are no currently known preferred distances for distances A, B, and C, because the spacing between the leads is in three dimensions, the combination of distances A, B and C preferably meet the following criteria:

1. allow for minimum spacing between adjacent leads so as to maximize the effective lead pitch, and 2. ensure that adjacent leads stay apart and no shorting occurs, especially due to solder bridging caused by the second level package chip attach process. Both of these criteria are desirable goals to problems that are well understood in the art. Also note that as illustrated in FIG. 5, the distances A and C need not be the same.

Figure 6:
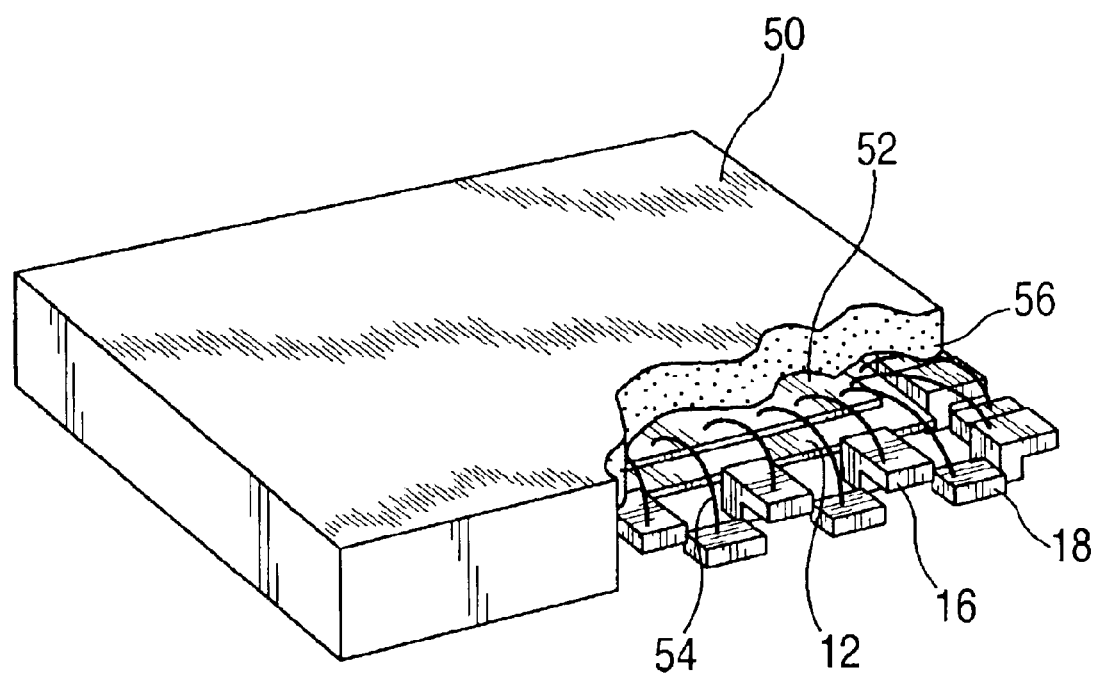
FIG. 6 is a cutaway view of a chip package formed according to the present invention.

A chip package, designated generally by reference numeral 50, as illustrated in FIG. 6 includes a chip 52 attached to the central region (die pad) 12 and wire interconnects 54 extending between the chip's I/Os and leads 16, 18, all of which are encapsulated in an epoxy resin 56. Hence, once the partial etching process is completed, chip 52 may be attached to central region 12 of lead frame 10, conductive wires 54 may interconnect the input and outputs of the chip to leads 16, 18, and epoxy 56 may be used to encapsulate the chip, lead frame, and conductive interconnects, while leaving the bottom surface of the central region 12 and leads 16, 18 exposed, performed in a conventional manner that is well understood in the art. A conventional saw singulation process may then be used to cut away the peripheral edge 14, thereby altering the package in order to expose the ends of leads 16, 18. The package may then be soldered to an integrated circuit board in a conventional manner.

It should be understood that the lead frame described herein, and the process for manufacturing lead frame 10, could be employed to manufacture a "sheet" of lead frames (for instance a 4×4 sheet containing 16 lead frames), a process that is well understood in the art.

The present invention has been shown and described by way of a presently preferred embodiment, and many variations and modifications may be made therein without departing from the scope and spirit of the invention, as defined by the appended claims.

What is claimed is:

1. A lead frame for use in a chip package, comprising:
   a. a central region having a first plurality of sides;
   b. a peripheral edge region having a second plurality of sides positioned in spaced relation around said central region;
   c. a first set of leads extending from each of said second plurality of sides, each of said first set of leads being partially defined by a first terminal end, first opposing side surfaces each of which extends along a respective first longitudinal axis, and a lower surface that extends in a first plane;
   d. a second set of leads extending from said second plurality of sides, each of said second set of leads being partially defined by a second terminal end, second opposing side surfaces each of which extends along a respective second longitudinal axis, and an upper surface that extends in a second plane; and
   e. wherein each of said first set of leads are positioned in staggered non-overlapping relation to corresponding ones of said second set of leads such that said first terminal ends are spaced from said second terminal ends by a first predetermined distance, each of said first longitudinal axes are substantially parallel to and spaced from the adjacent ones of said second longitudinal axes by a second predetermined distance, and said first plane is spaced from said second plane by a third predetermined distance.

2. The lead frame according to claim 1, wherein said first set of leads are formed by a mask having resist material arranged to define the pattern of said first set of leads.

3. The lead frame according to claim 1, wherein said second set of leads are formed by a first mask having resist material arranged to define the pattern of said second set of leads.

4. The lead frame according to claim 3, wherein said first set of leads are formed by a second mask having resist material arranged to define the pattern of said first set of leads, said first and second masks being asymmetrical with respect to one another.

5. A chip package, comprising:
   a. a first set of leads each of which is partially defined by a first terminal end, first opposing side surfaces each of which extends along a respective first longitudinal axis, and a lower surface that extends in a first plane;
   b. a second set of leads each of which is partially defined by a second terminal end, second opposing side surfaces each of which extends along a respective second longitudinal axis, and an upper surface that extends in a second plane; and
   c. wherein each of said first set of leads are positioned in non-overlapping staggered relation to corresponding ones of said second set of leads such that said first terminal ends are spaced from said second terminal ends by a first predetermined distance, each of said first longitudinal axes are substantially parallel to and spaced from the adjacent ones of said second longitudinal axes by a second predetermined distance, and said first plane is spaced from said second plane by a third predetermined distance.

6. The chip package of claim 5, further comprising a die pad positioned in spaced relation to said first and second sets of leads.

7. The chip package according to claim 6, further comprising a chip having a predetermined number of input/outputs and mounted on said die pad.

8. The chip package according to claim 7, further comprising wire bonds interconnecting said input/outputs of said chip to corresponding ones of said first and second sets of leads.

9. The chip package according to claim 8, further comprising an epoxy resin encapsulating said package leaving a portion of said first and second sets of leads exposed.

* * * * *